(12) United States Patent
Cao et al.

(10) Patent No.: US 9,455,277 B2
(45) Date of Patent: Sep. 27, 2016

(54) ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Zhaokeng Cao, Shanghai (CN); Dandan Qin, Shanghai (CN); Tingting Cui, Shanghai (CN); Kerui Xi, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/723,227

(22) Filed: May 27, 2015

(65) Prior Publication Data

US 2016/0126257 A1 May 5, 2016

(30) Foreign Application Priority Data

Oct. 29, 2014 (CN) .......................... 2014 1 0593966

(51) Int. Cl.
| | |
|---|---|
| G02F 1/133 | (2006.01) |
| H01L 27/12 | (2006.01) |
| G02F 1/1368 | (2006.01) |
| G02F 1/1362 | (2006.01) |
| G02F 1/1335 | (2006.01) |

(52) U.S. Cl.
CPC .......... *H01L 27/124* (2013.01); *G02F 1/1368* (2013.01); *G02F 1/133514* (2013.01); *G02F 1/136286* (2013.01); *H01L 27/1218* (2013.01); *H01L 27/1255* (2013.01)

(58) Field of Classification Search
None
See application file for complete search history.

(56) References Cited

U.S. PATENT DOCUMENTS

| | | | | |
|---|---|---|---|---|
| 6,414,740 | B1 | 7/2002 | Hosoyamada | |
| 7,492,344 | B2 * | 2/2009 | Yang | G09G 3/3648 345/101 |
| 2006/0157710 | A1 * | 7/2006 | Lee | H01L 27/13 257/72 |
| 2007/0012897 | A1 * | 1/2007 | Lee | G02F 1/133382 252/299.1 |
| 2011/0268151 | A1 * | 11/2011 | Hadwen | B01L 3/502792 374/141 |
| 2014/0146033 | A1 * | 5/2014 | Koyama | G09G 3/3655 345/212 |

* cited by examiner

*Primary Examiner* — Phu Vu
(74) *Attorney, Agent, or Firm* — Anova Law Group, PLLC

(57) ABSTRACT

An array substrate includes a substrate, a plurality of gate lines and a plurality of data lines intersecting each other and being insulating from each other, and a plurality of pixel units arranged in an array and surrounded by the intersecting gate lines and data lines. The array substrate also includes at least one temperature measuring unit and at least one gate signal start control line. The temperature measuring unit includes at least one thin film transistor. The array substrate further includes a signal input line, a signal output line, and resistor is arranged on the signal input line. The temperature measuring unit includes a first terminal electrically connected with the signal input line and a second terminal electrically connected with the signal output line.

13 Claims, 7 Drawing Sheets

ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410593966.0, filed with the Chinese Patent Office on Oct. 29, 2014 and entitled "ARRAY SUBSTRATE, DISPLAY PANEL AND DISPLAY DEVICE", the content of which is incorporated herein by reference in its entirety.

BACKGROUND OF THE INVENTION

Display panels have the advantages of being light and thin, low power consumption, low radiation and the like, and are now widely used in portable electronic products, such as mobile phones, Personal Digital Assistants (PDA) and the like. Examples of display panels are Thin Film Transistor-Liquid Crystal (TFT-LCD) display panels, Organic Light Emitting Diode (OLED) display panels, Low Temperature Poly-silicon (LTPS) display panels, Plasma Display Panels (PDP), etc. A liquid crystal display panel usually includes an array substrate, a color filter substrate and liquid crystal molecules disposed between the array substrate and the color filter substrate. With the rapid development of display technology, the requirements of consumers on the imaging quality of the displays are higher and higher. The requirements of the consumers on the good display effects of the displays are increasingly improved.

In a liquid crystal display device, the aperture ratio refers to the proportion of the area of the portion where light passes by excluding the wiring portion and the transistor portion (generally hidden by a black matrix) of each sub-pixel and the integral area of each sub-pixel. The higher the aperture ratio is, the higher the light passing efficiency is. When the light is emitted by a backlight panel, not all light can penetrate through the panel. For example, signal lines for a source driving chip and a gate driving chip of a liquid crystal display, a thin film transistor (TFT) itself, a storage capacitor used for storing voltage, and the like, such places need to be shaded by a black matrix (black matrix) due to the incomplete transparency of these places and that the light passing by these places is not controlled by the voltage and a correct gray level can not be displayed, so as not to interfere with other transparent areas. The proportion of the effective transparent area to the entire area is referred to as the aperture ratio. In general, in order to ensure the high aperture ratio of the panel to improve the display effect of the panel, no additional device will be arranged in the display area of the panel, thus the devices arranged in the display area of the panel are generally pixel devices related to pixels, while the devices used for detecting the performance of the panel are generally arranged in the non-display area of the panel.

BRIEF SUMMARY OF THE INVENTION

Embodiments of the present invention relate to an array substrate. The array substrate includes a substrate, a plurality of gate lines and a plurality of data lines arranged on the substrate, the gate lines intersect the data lines and are insulated from the data lines, and a plurality of pixel units arranged in an array and surrounded by the intersecting gate lines and the data lines. The array substrate also includes a gate signal start control line, a signal input line and a signal output line, a resistor is arranged on the signal input line, and a temperature measuring unit comprising at least one thin film transistor, a first terminal electrically connected with the signal input line, and a second terminal electrically connected with the signal output line.

Embodiments of the present invention relate to a display panel containing the above-described array substrate

BRIEF DESCRIPTION OF THE DRAWINGS

In order to make the technical solutions according to the embodiments of the invention more apparent, the drawings to be used in a description of the embodiments will be described below briefly, and apparently the drawings described below are only some of the embodiments of the invention, and those ordinarily skilled in the art can further derive other drawings without any inventive effort from these drawings in which.

DETAILED DESCRIPTION OF THE INVENTION

A clear and complete description of technical solutions in embodiments of the present invention will be given below in combination with the accompanying drawings. Apparently, the embodiments are described herein by way of illustration, and not by way of limitation. Features described with respect to different embodiments can be combined by those ordinarily skilled in the art without departing from the protection scope of the present invention.

Figure 1:
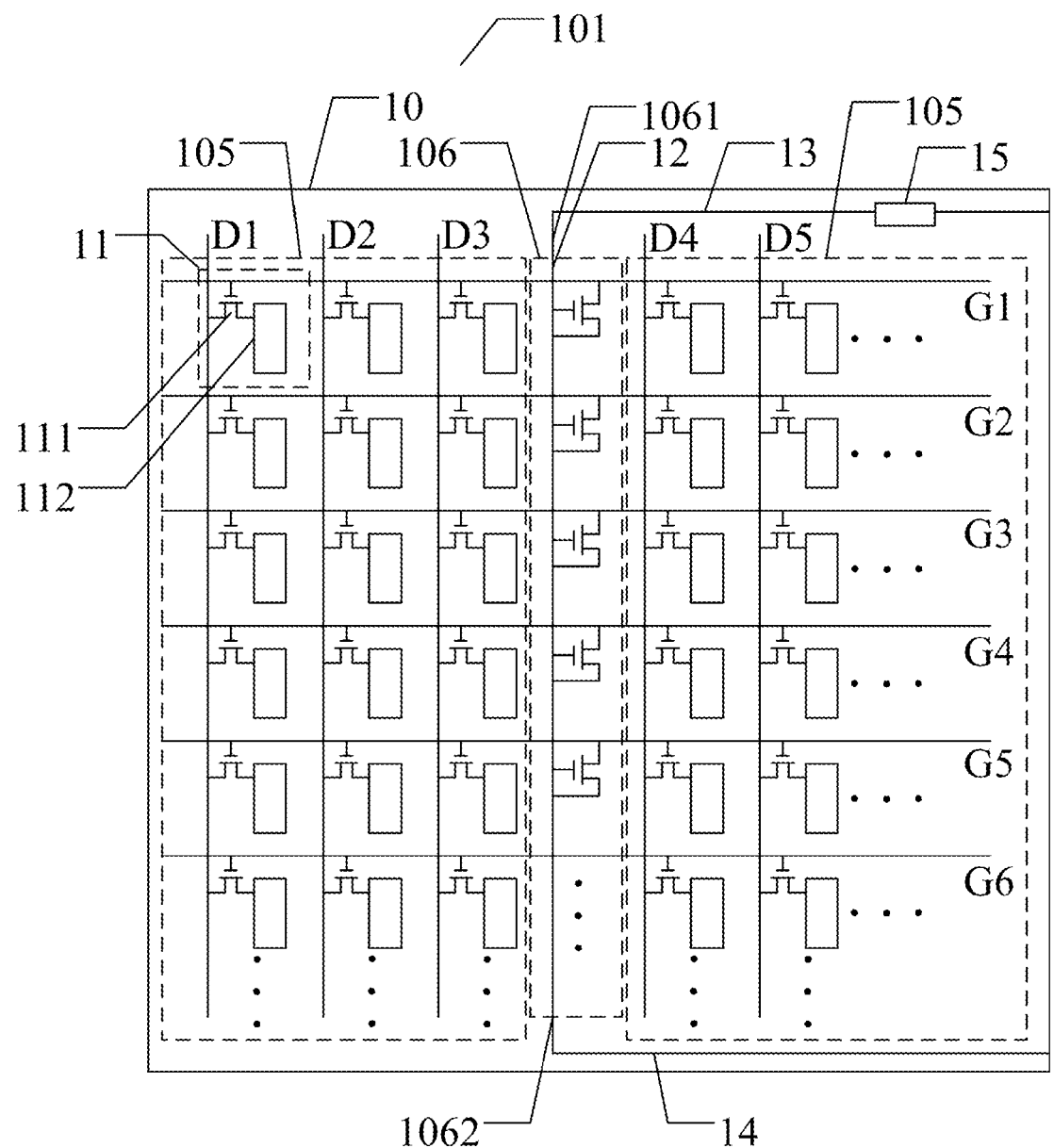
FIG. 1 is a schematic structural diagram of an array substrate according to an embodiment of the present invention.

Embodiments of the present invention disclose an array substrate 101, as shown in FIG. 1. The array substrate 101 includes a substrate 10, and a plurality of gate lines Gn arranged in parallel and a plurality of data lines Dn arranged in parallel on the substrate 10. As can be seen from FIG. 1, the gate lines Gn includes G1, G2, G3 to Gn arranged sequentially, and n is a positive integer; the data lines includes D1, D2, D3 to Dn arranged sequentially, and n is a positive integer. The gate lines intersect the data lines and are insulated from the data lines; the gate lines and the data lines define a plurality of pixel units 105 arranged in an array; each of the pixel units 105 includes a plurality of sub-pixels 11, each of the sub-pixels 11 includes a pixel electrode 112 and a pixel switch 111, and the pixel switch 111 is an amorphous silicon thin film transistor. The array substrate 101 includes at least one temperature measuring unit 106 and at least one gate signal start control line 12, and the temperature measuring unit 106 includes at least one thin film transistor; the array substrate includes a signal input line 13 and a signal output line 14, the temperature measuring unit 106 includes a first terminal 1061 and a second terminal 1062, the first terminal 1061 is electrically connected with the signal input line 13, and the second terminal 1062 is electrically connected with the signal output line 14; a resistor 15 is arranged on the signal input line 13.

Figure 2:
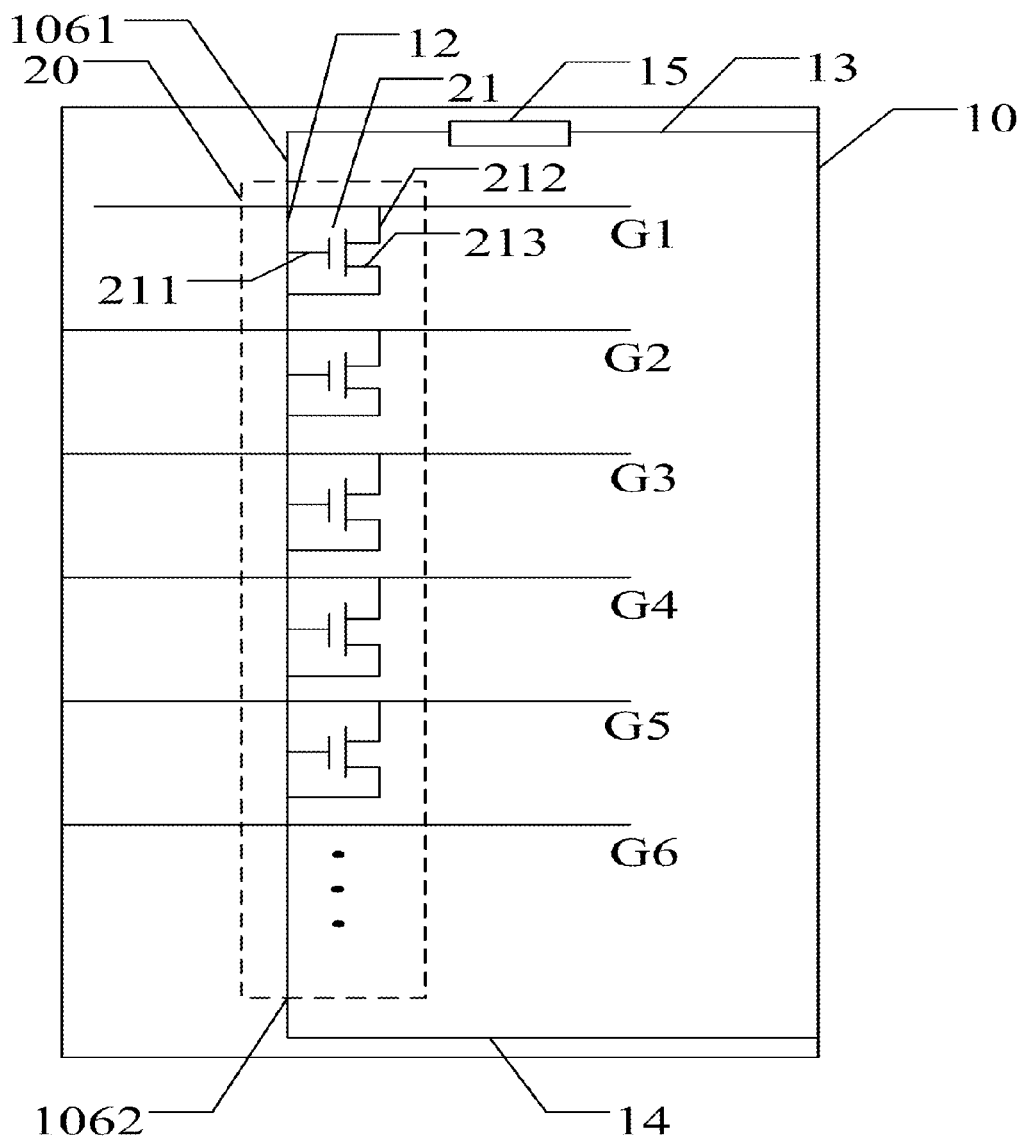
FIG. 2 is a schematic structural diagram of a first measuring unit according to an embodiment of the present invention.

The temperature measuring unit 106 includes a plurality of first measuring units 20, as shown in FIG. 2, the thin film transistor 21 is arranged in the first measuring unit 20, the thin film transistor is an N-type transistor, and the N-type transistor is a transistor which is turned on at a high voltage and turned off at a low voltage; the thin film transistor 21 includes a gate 211, a source 212 and a drain 213. The gate signal start control line 12 is arranged in the first measuring unit 20, the gate 211 and the drain 213 of the thin film transistor 21 are both electrically connected with the gate signal start control line 12, the source 212 is electrically connected with the gate line Gn, the gate signal start control line 12 includes a third terminal and a fourth terminal, the third terminal of the gate signal start control line 12 is the first terminal 1061 of the temperature measuring unit, and the fourth terminal of the gate signal start control line is the second terminal 1062 of the temperature measuring unit. The first measuring unit includes at least one thin film transistor.

Figure 3:
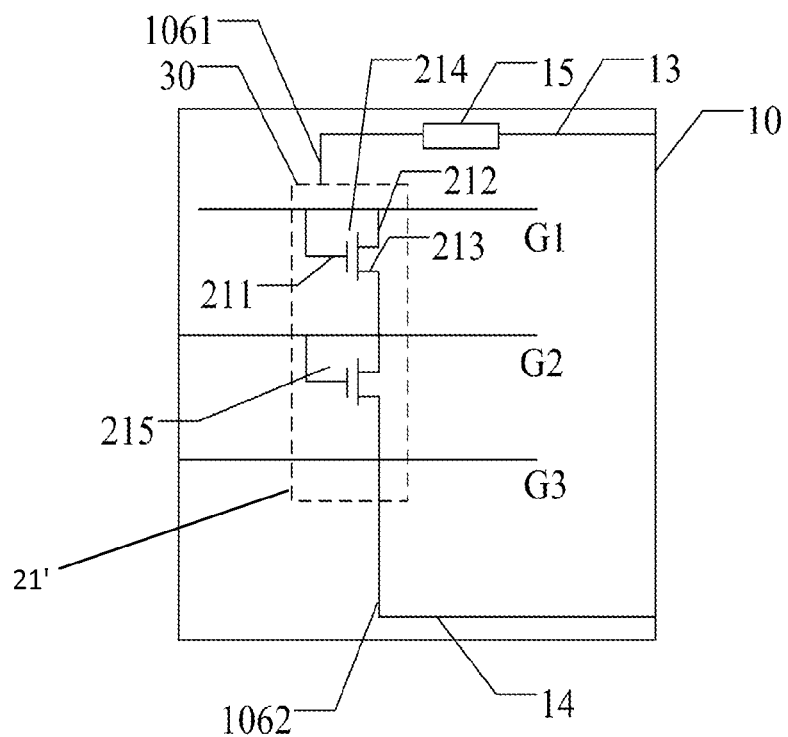
FIG. 3 is a schematic structural diagram of a second measuring unit according to an embodiment of the present invention.

The temperature measuring unit 106 further includes a plurality of second measuring units 30, as shown in FIG. 3, a thin film transistor array 21' is arranged in the second measuring unit 30, the thin film transistor array 21' includes a first thin film transistor 214 and a second thin film transistor 215, each of the first transistor 214 and the second transistor 215 includes a gate 211, a source 212 and a drain 213. The gate 211 of the first transistor 214 is the first terminal 1061 of the temperature measuring unit, the source 212 of the first transistor 214 is electrically connected with the gate line G1, the drain of the second transistor 215 is the second terminal 1062 of the temperature measuring unit, and the gate of the second thin film transistor 215 is electrically connected with the gate line G2. The drain 213 of the first thin film transistor 214 is electrically connected with the source of the second thin film transistor 215.

Figure 4:
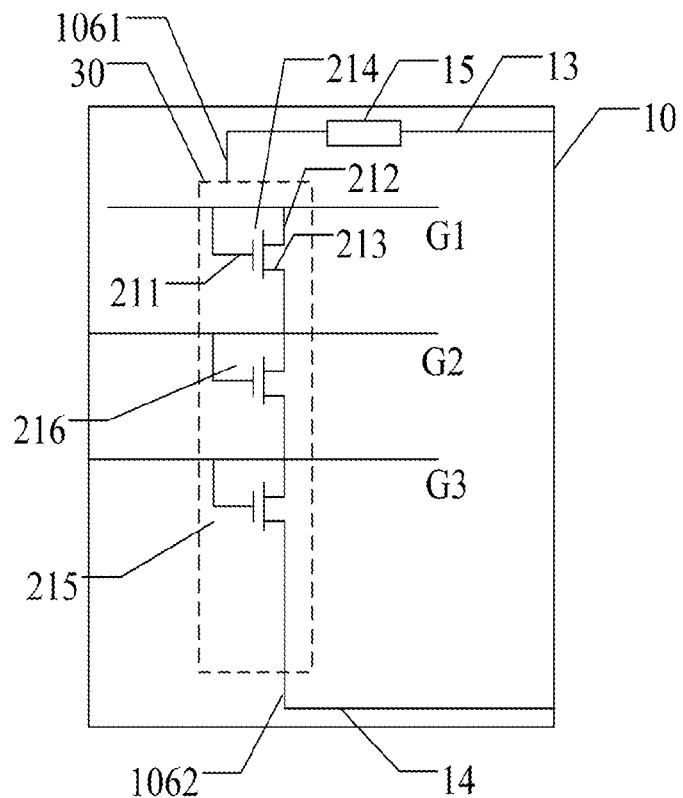
FIG. 4 is another schematic structural diagram of a second measuring unit according to an embodiment of the present invention.

The foregoing descriptions are merely an implementation of the embodiment of the present invention, the implementation of the embodiment of the present invention can also be as shown in FIG. 4, where the thin film transistor array 21' may include the first transistor 214, the second transistor 215 and a third transistor 216, each of the first transistor 214, the second transistor 215 and the third transistor 216 includes a gate 211, a source 212 and a drain 213. The gate 211 of the first transistor 214 is the first terminal 1061 of the temperature measuring unit, the source 212 of the first transistor 214 is electrically connected with the gate line G1, the drain of the first transistor 214 is electrically connected with the source of the third transistor 216, and the drain of the third transistor 216 is electrically connected with the source of the second transistor 215, the gate of the third transistor 216 is electrically connected with the gate line G2; the drain of the second transistor 215 is the second terminal 1062 of the temperature measuring unit, and the gate of the second thin film transistor 215 is electrically connected with the gate line G3.

Figure 5:
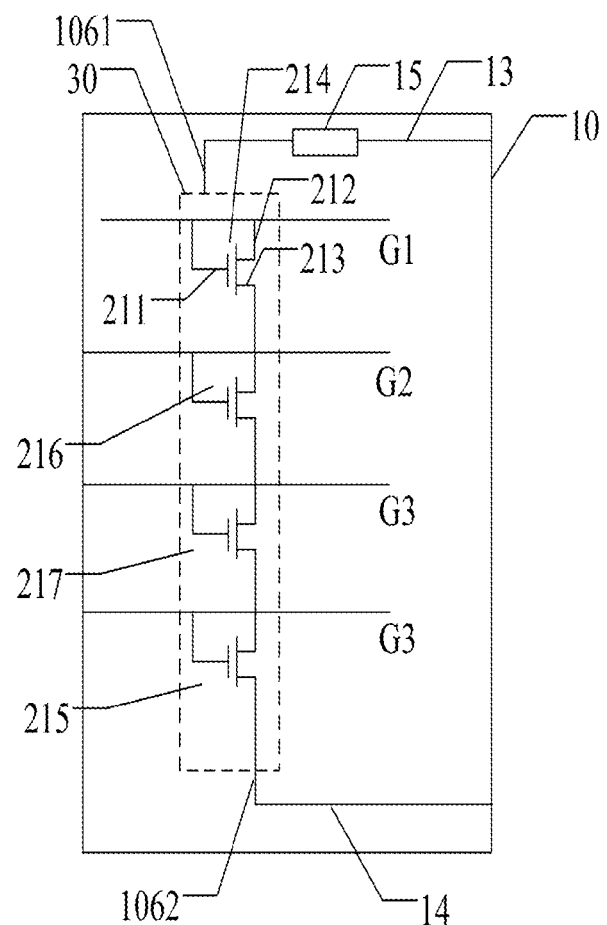
FIG. 5 is still another schematic structural diagram of a second measuring unit according to an embodiment of the present invention.

The foregoing descriptions are merely an exemplary embodiment of the present invention. Another exemplary embodiment of the present invention is shown in FIG. 5. The thin film transistor array 21' may include the first transistor 214, the second transistor 215, the third transistor 216 and a fourth transistor 217, each of the first transistor 214, the second transistor 215, the third transistor 216 and the fourth transistor 217 includes a gate 211, a source 212 and a drain 213. The gate 211 of the first transistor 214 is the first terminal 1061 of the temperature measuring unit; the source 212 of the first transistor 214 is electrically connected with the gate line G1, the drain 213 of the first transistor 214 is electrically connected with the source of the third transistor 216, the drain of the third transistor 216 is electrically connected with the source of the fourth transistor 217, and the gate of the third transistor 216 is electrically connected with the gate line G2; the drain of the fourth transistor 217 is electrically connected with the source of the second transistor 215, the gate of the fourth transistor 217 is electrically connected with the gate line G3; the drain of the second transistor 215 is the second terminal 1062 of the temperature measuring unit, and the gate 211 of the second thin film transistor 215 is electrically connected with the gate line G4.

The foregoing descriptions are merely exemplary embodiments of the present invention, the implementation of the embodiment of the present invention can also be as follows: the second measuring unit can include a plurality of serially connected fourth transistors.

Figure 6:
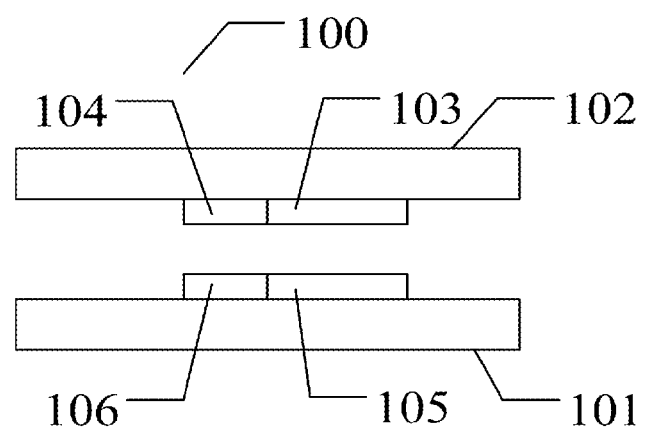
FIG. 6 is a sectional view of a display panel according to an embodiment of the present invention.

Embodiments of the present invention further provide a display panel 100, as shown in FIG. 6. The display panel 100 includes the array substrate 101 as described above, and a color filter substrate 102 arranged opposite to the array substrate 101, the color filter substrate 102 includes a color resist unit area 103 and a preset light shielding area 104, the color resist unit area 103 is arranged opposite to a pixel unit 105 on the array substrate 101, and the preset light shielding area 104 is arranged opposite to the temperature measuring unit 106 on the array substrate 101. A black matrix BM can be arranged in the preset light shielding area. Only a part of the structure of the display panel is described in FIG. 6, the specific structure can be set according to actual designs, for example, a plurality of temperature measuring units can be arranged between the sub-pixels in the pixel unit.

Figure 7:
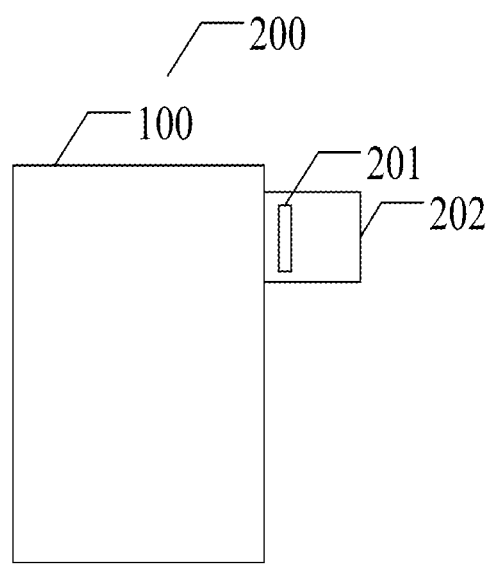
FIG. 7 is a schematic planar diagram of a display device according to an embodiment of the present invention.

Embodiments of the present invention further provide a display device 200, as shown in FIG. 7. The display device 200 includes the display panel 100 as described above, wherein the display device includes an IC 201 and a flexible printed circuit board (FPC) 202, the IC 201 is located on the flexible printed circuit board (FPC) 202, the IC 201 or the FPC 202 inputs a signal to the display panel 100 through the signal input line 13 and the display panel 100 returns an output signal to the IC or the FPC through the signal output line 14. The foregoing descriptions are merely an exemplary embodiment of the present invention, an alternative embodiment of the present invention can also be as follows: the IC is located on the display panel.

Figure 8A:
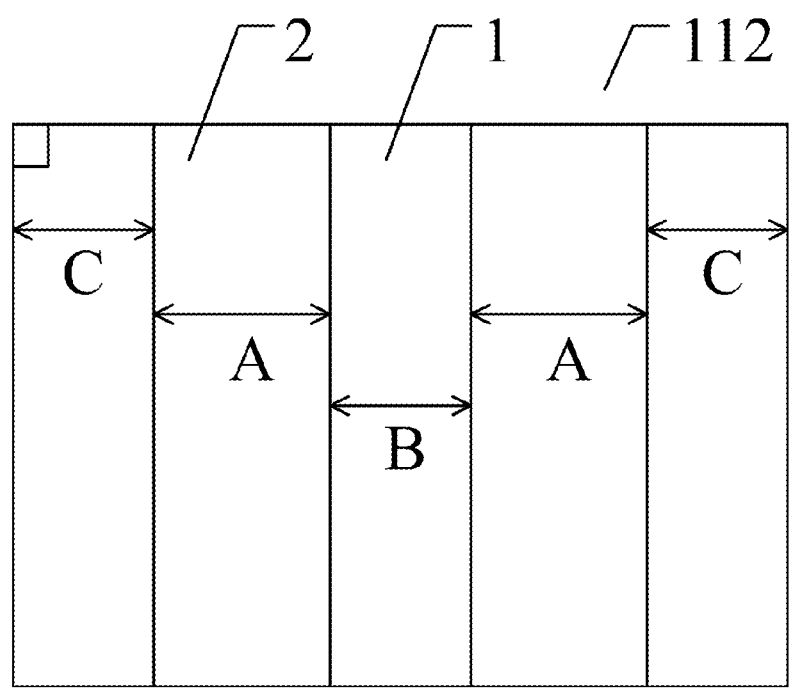
FIG. 8A is a schematic structural diagram of a sub-pixel according to an embodiment of the present invention.

FIG. 8A is a schematic structural diagram of a sub-pixel according to an embodiment of the present invention. The sub-pixel electrode 112 includes a strip electrode 1, then the sub-pixel includes at least one slit (slit) 2. Assuming that each sub-pixel has n slits, the line width of the slit is A, the line width of the strip electrode is B, and it is assumed that the necessary distance from the slit to the pixel edge is C, which is not smaller than 2 μm, the width of the entire sub-pixel 11 is L, then the allocation of the line width and the line spacing of the slit is the most reasonable as the width of the sub-pixel is just 2C+nA+(n+1)B (top com structure) or 2C+nA+(n−1)B (mid com structure). It can be seen from FIG. 8A that, the sub-pixel electrode 112 and the strip electrode 1 are both rectangular, thus the line width L of the sub-pixel, the line width A of the slit and the line width B of the strip electrode are determined based on a direction vertical to the slit 2, and the line width L of the sub-pixel, the line width A of the slit and the line width B of the strip electrode are the length along the width direction of the rectangle.

Generally when designing the pixel structure, due to the limited process capacity, the line width and the line spacing of the pixel slit are limited. In general, the widths of the strip electrode, the slit and the pixel satisfy L=2C+nA+(n−1)B or L=2C+nA+(n+1)B. If the width L of the pixel is slightly larger than 2C+nA+(n+1)B or 2C+nA+(n−1)B, but can not be enough to add the line widths of a new set of slit and strip electrode, the allocation of the slit is unreasonable, that is, when the width L of the sub-pixel is larger than 2C+nA+(n−1)B and is smaller than 2C+(n+1)A+nB, or L is larger than 2C+nA+(n+1)B and is smaller than 2C+(n+1)A+(n+2)B, the line width of the slit is generally increased, or the line spacing of the slit is generally increased. However, in the case of a part of particular pixels, for example, a pixel with 5.5 inch HD resolution, if the line width of the slit is simply increased or if the line spacing of the slit is simply increased, a severe black domain will occur thus resulting in the condition that the aperture ratio is increased, but the transmittance is not correspondingly increased.

In the embodiment of the present invention, the line width of the slit is not increased, or the line spacing of the slit is not increased, but the pixel electrode is still designed according to the relationship of L=2C+nA+(n−1)B or L=2C+nA+(n+1)B. Compared with the prior art, the sub-pixels are compressed, after each sub-pixel is compressed, the excessive area is arranged with the temperature measuring unit described in the present invention. If the temperature measuring unit needs to be arranged, at least three sub-pixels need to be compressed, only in this way, the compressed area is large enough to arrange the temperature measuring unit. In the prior art, the temperature measuring unit is generally arranged in the non-display area of the panel, if being arranged in the display area of the panel, the aperture ratio of the panel will be reduced to influence the display effect of the panel. While in the embodiment of the present invention, the temperature measuring unit is arranged in the pixel compression area, so that the display effect of the panel will not be influenced, and the additional functional area capable of measuring the panel temperature can be further arranged in the display area of the panel.

Figure 8B:
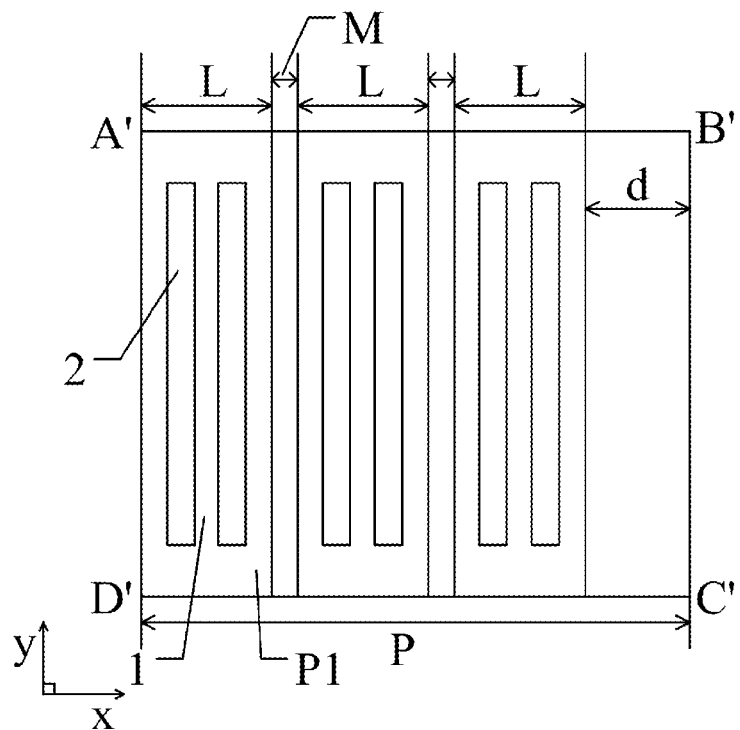
FIG. 8B is a schematic structural diagram of a pixel unit according to an embodiment of the present invention.

In the embodiment of the present invention, each sub-pixel includes at least one slit 2 and a strip electrode 1, as shown in FIG. 8B, x axis and y axis are arranged perpendicular to each other, the x axis is the horizontal direction, the y axis is the vertical direction. The sub-pixel and the pixel unit are a rectangle, it can be seen from FIG. 8b, the four vertexes of the rectangle are A', B', C' and D', in the rectangle A'B'C'D', the line segments A'B' and C'D' are parallel to the x axis, the line segments A'D' and B'C' are parallel to the y axis, the lengths of the rectangle are the line segments A'B' and C'D', and the length of the line segment A'B' is the line width P of the pixel unit; if the compression length of each sub-pixel is defined as a, if three sub-pixels are compressed, the length d of the compression area satisfies the relations: d=3a, wherein 0.5 μm≤a≤2.5 μm.

Above all, and in combination with FIG. 8A, P, L, M and d satisfy the following relational expression:

$$P=3L+2M+d,$$

wherein d=3a, 0.5 μm≤a≤2.5 μm, and 5 μm≤M≤6 μm.

$$L=2C+nA+(n-1)B \text{ or } L=2C+nA+(n+1)B;$$

then the relation of the width P of the pixel unit and the width B of the strip electrode and the line width A of the slit in the sub-pixel can be obtained as follows:

$$P=3[2C+nA+(n-1)B]+2M+3a,$$

wherein A>0, B>0, C≥2 μm, 5 μm≤M≤6 μm, 0.5 μm≤a≤2.5 μm;

or, $P=3[2C+nA+(n+1)B]+2M+3a,$ wherein A>0, B>0, C≥2 μm, 5 μm≤M≤6 μm, 0.5 μm≤a≤2.5 μm;

The sub-pixel is compressed by adopting the above described method, and the temperature measuring unit is arranged in the pixel compression area, so that the display effect of the panel will not be affected, and the additional functional area capable of measuring the panel temperature can be further arranged in the display area of the panel.

In the embodiment of the present invention, one temperature measuring unit is arranged for every n sub-pixels 112, the width of the temperature measuring unit is W, then W≥n×3a, wherein n is a positive integer, and n≥3; 0.5 μm≤a≤2.5 μm and a is the compression length of each sub-pixel.

According to the array substrate and the display panel including the array substrate provided by some embodiments of the present invention, an additional functional area, that is, the temperature measuring unit, is arranged in the display area of the panel, the temperature measuring unit can detect the panel temperature during display of the panel. The IC or the FPC inputs a signal to the display panel by the signal input line and the display panel returns the output signal to the IC or the FPC through the signal output line. In a process of inputting and outputting the signal to and from the temperature measuring unit, the panel temperature is calculated according to the relationship between the input voltage, resistance and output voltage and the panel temperature, if the panel temperature is overheated, the panel temperature can be reduced by adopting a cooling method, in order to avoid poor display or damage to the display panel and the display device due to overheating temperature.

Figure 9:
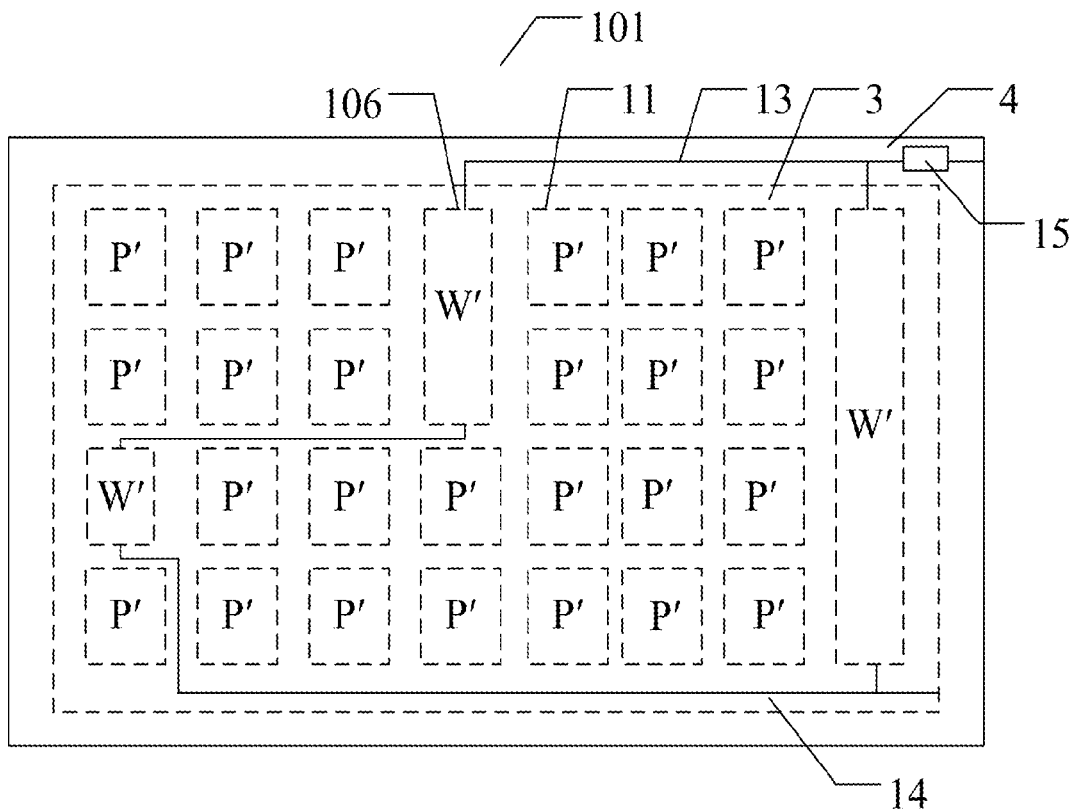
FIG. 9 is another schematic structural diagram of an array substrate according to an embodiment of the present invention.

Referring to FIG. 9, an array substrate 101 includes a display area 3 and a non-display area 4. As shown in FIG. 9, the temperature measuring unit 106 is represented by W', the sub-pixel 11 is represented by P', and at least three sub-pixels need to be compressed to obtain the area necessary for accommodating the temperature measuring unit; a plurality of temperature measuring units can be located in the same column, a plurality of temperature measuring units can be arranged in a column, or only one temperature measuring unit is arranged in a column; the temperature measuring units can also be located in different columns, and a plurality of temperature measuring units can also be arranged between two rows of sub-pixels; the temperature measuring units on the array substrate are all electrically connected with the signal input line 13 and the signal output line 14.

All the temperature measuring units as shown in FIG. 9 can be the first measuring units, that is, all the temperature measuring units include gate signal start control lines, the first measuring units can be located on the same column and can also be located on different columns; the thin film transistors electrically connected with the same gate signal start control line are serially connected, and the thin film transistors electrically connected with different gate signal start control lines are connected in parallel; each gate signal start control line can be a straight line, a broken line, or a wavy line.

The foregoing descriptions are merely an exemplary embodiment of the present invention, other embodiments of the present invention can also be as follows: the temperature measuring unit on the array substrate includes at least one first measuring unit and at least one second measuring unit, the gate signal start control line is arranged in the first measuring unit, no gate signal start control line is arranged in the second measuring unit, and the thin film transistor in the first measuring unit is connected with the thin film transistor in the second measuring unit in parallel.

In the embodiment of the present invention, the specific manner of testing the panel temperature by adopting the temperature measuring unit is to obtain the panel temperature according to the relation of a voltage Vout output from the signal output line and the temperature T of the panel. Specifically, the corresponding relationship of the output voltage and the temperature is as follows: it is measured that the voltage Vout=x, the current panel temperature can be calculated by the following corresponding relationship, namely, the equivalent formula in this example is:

$$T=y=1.8682x^3-27.078x^2+158.47x-336.88$$

Figure 10:
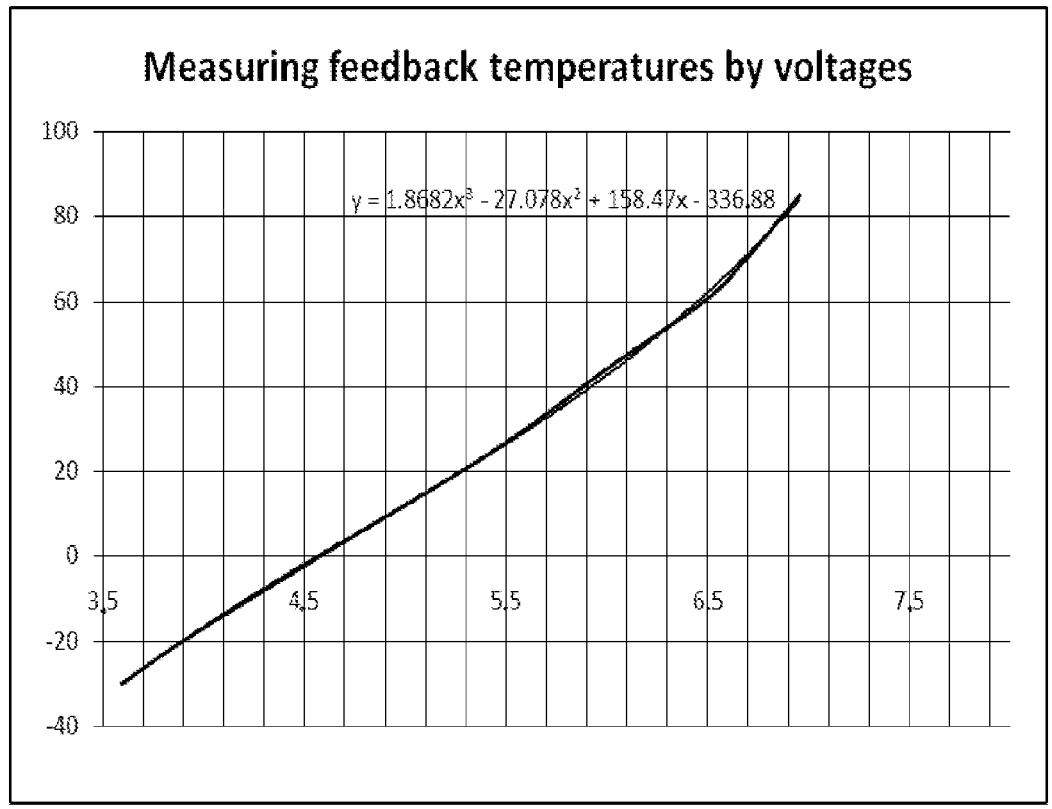
FIG. 10 is a graph illustrating the relationship between an output voltage and a panel temperature according to an embodiment of the present invention.

FIG. 10 is a graph illustrating the relationship between an output voltage and a panel temperature provided by an embodiment of the present invention. As shown in FIG. 10, the output voltage is the data on the horizontal ordinate x axis, the panel temperature is the data on the vertical coordinate y axis, and different output voltages correspond to different panel temperatures. The graphical relationship between the output voltage and the panel temperature provided in the figure will be recorded in the IC or the FPC, when the signal output line returns the output signal to the IC or the FPC, the IC or the FPC will obtain the panel temperature value according to the recorded graphical relationship and provide an alarm. Users can take corresponding operations according to the temperature value. In general, the operational temperature of the liquid crystal molecules in the liquid crystal display device can not exceed 60° C. If the temperature exceeds 60° C., then the liquid crystal molecules will stop rotating, resulting in a non-working display panel, whereas, with a display panel according to the present invention, a user will know whether the panel is overheated at any time in order to take appropriate cooling measures to ensure the normal working operation of the display device without influencing the display effect. If being applied in a precise instrument, this panel design has more significant effect. If the precise instrument stops working due to temperature overheating, irreparable loss will be generated, whereas, with the panel according to the present invention, this phenomenon can be effectively avoided.

The array substrate, the display panel composed of the array substrate and the display device including the display panel provided by the preferred embodiments of the present invention have been described above in detail. However, the principle and the implementations of the present invention should be considered as illustrative, and not as being limited to the particular embodiments of the present invention. It should be appreciated that variations may be made in those embodiments by those of ordinary skill in the art without departing from the scope of the present invention as defined by the following claims.

What is claimed is:

1. An array substrate comprising:
   a substrate;
   a plurality of gate lines and a plurality of data lines arranged on the substrate, the gate lines intersecting the data lines and being insulated from the data lines;
   a plurality of pixel units arranged in an array and surrounded by the intersecting gate lines and the data lines;
   a gate signal start control line;
   a signal input line and a signal output line;
   a resistor connected in series to the signal input line; and
   a temperature measuring unit comprising at least one thin film transistor, a first terminal electrically connected with the signal input line, and a second terminal electrically connected with the signal output line.

2. The array substrate of claim 1, wherein the temperature measuring unit comprises a plurality of first measuring units, a thin film transistor arranged in each of the first measuring units, the thin film transistor being an N-type transistor and comprising a gate, a drain, and a source.

3. The array substrate of claim 2, wherein the gate signal start control line is arranged in the first measuring units and electrically connected with the gate and the drain of each thin film transistor, the source of each thin film transistor being electrically connected with a different one of the gate lines, the gate signal start control line comprising a third terminal being the first terminal of the temperature measuring unit, and a fourth terminal being the second terminal of the temperature measuring unit.

4. The array substrate of claim 2, wherein the temperature measuring unit further comprises a plurality of second measuring units, a thin film transistor array arranged in each of the second measuring units and comprising a first thin film transistor and a second thin film transistor, a gate of the first thin film transistor being the first terminal of the temperature measuring unit, a source of the first thin film transistor being electrically connected with one of the gate lines; a drain of the second thin film transistor is the second terminal of the temperature measuring unit, and a gate of and the second thin film transistor being electrically connected with another one of the gate lines.

5. The array substrate of claim 4, wherein a drain of the first thin film transistor is electrically connected with a source of the second thin film transistor.

6. The array substrate of claim 4, wherein the thin film transistor array further comprises a third transistor.

7. The array substrate of claim 6, wherein a drain of the first thin film transistor is electrically connected with a source of the third thin film transistor, and a drain of the third thin film transistor is electrically connected with a source of the second thin film transistor.

8. The array substrate of claim 6, wherein the thin film transistor array further comprises a fourth thin film transistor, a drain of the first thin film transistor is electrically connected with the source of the third thin film transistor, a drain of the third thin film transistor is electrically connected with a source of the fourth thin film transistor, and a drain of the fourth thin film transistor is electrically connected with a source of the second thin film transistor.

9. The array substrate of claim 4, wherein each of the second measuring units comprises a plurality of serially connected thin film transistors.

10. The array substrate of claim 1, wherein each of the pixel units comprises a plurality of sub-pixels, one temperature measuring unit being arranged for every n sub-pixels, a width of the one temperature measuring unit is defined as W, a compression length of each sub-pixel is defined as a, W, n, and a satisfy the relations: W≥n×3a, wherein n is a positive integer greater than or equal to 3; and 0.5 μm≤a≤2.5 μm.

11. The array substrate of claim 1, wherein the gate signal start line is a straight line, a broken line, or a wavy line.

12. A display panel comprising an array substrate and a color filter substrate arranged opposite to the array substrate, the color filter substrate comprising a color resist unit area arranged opposite to a pixel unit area on the array substrate, and a preset light shielding area arranged opposite to a temperature measuring unit on the array substrate; wherein the array substrate comprises:

a substrate;

a plurality of gate lines and a plurality of data lines arranged on the substrate, the gate lines intersecting the data lines and being insulated from the data lines;

a plurality of pixel units arranged in an array and surrounded by the intersecting gate lines and the data lines;

a gate signal start control line;

a signal input line and a signal output line; and a resistor is arranged on the signal input line;

wherein the temperature measuring unit comprises at least one thin film transistor, a first terminal electrically connected with the signal input line, and a second terminal electrically connected with the signal output line.

13. A display device comprising the display panel of claim 12, an integrated circuit (IC) and a flexible printed circuit board, wherein the IC or the flexible printed circuit board inputs a signal to the display panel through the signal input line, and the display panel returns an output signal to the IC or the flexible printed circuit board through the signal output line.

* * * * *